(12) United States Patent
Ogawa et al.

(10) Patent No.: US 7,056,080 B2
(45) Date of Patent: Jun. 6, 2006

(54) TWO-ARM TRANSFER ROBOT

(75) Inventors: Hironori Ogawa, Osaka (JP); Sakiko Uno, Osaka (JP)

(73) Assignee: Daihen Corporation, Osaka (JP)

( * ) Notice: Subject to any disclaimer, the term of this patent is extended or adjusted under 35 U.S.C. 154(b) by 0 days.

(21) Appl. No.: 10/888,677

(22) Filed: Jul. 9, 2004

(65) Prior Publication Data
US 2005/0079043 A1 Apr. 14, 2005

(30) Foreign Application Priority Data
Jul. 11, 2003 (JP) ............................. 2003-195575

(51) Int. Cl.
*B25J 18/02* (2006.01)

(52) U.S. Cl. .............................. 414/744.5; 74/490.05; 414/917; 901/15; 901/28

(58) Field of Classification Search ............ 414/744.5, 414/744.1, 917; 901/15, 28, 29; 74/490.01, 74/490.05, 490.06
See application file for complete search history.

(56) References Cited

U.S. PATENT DOCUMENTS

| 5,151,008 | A | * | 9/1992 | Ishida et al. | 414/744.5 |
| 5,584,647 | A | * | 12/1996 | Uehara et al. | 414/744.5 |
| 5,765,444 | A | * | 6/1998 | Bacchi et al. | 74/490.03 |
| 6,364,599 | B1 | * | 4/2002 | Suwa et al. | 414/744.1 |
| 6,450,757 | B1 | * | 9/2002 | Saeki et al. | 414/744.5 |

FOREIGN PATENT DOCUMENTS

JP 11-33951 2/1999

* cited by examiner

*Primary Examiner*—Donald W. Underwood
(74) *Attorney, Agent, or Firm*—Hamre, Schumann, Mueller & Larson, P.C.

(57) ABSTRACT

A two-arm transfer robot includes a swivel base arranged to swivel about a vertical swivel axis, and a pair of link arm mechanisms attached to the swivel base. These two link arm mechanisms are symmetrical in structure and function with respect to the swivel axis. A first hand member is supported by one of the link arm mechanisms for carrying a work, while a second hand member is supported by the other link arm mechanism for carrying a work. The first hand member and the second hand member are horizontally movable at the same height without interfering with each other.

10 Claims, 16 Drawing Sheets

TWO-ARM TRANSFER ROBOT

BACKGROUND OF THE INVENTION

1. Field of the Invention

The present invention relates to two-arm transfer robots which are suitably used for horizontal transfer of disk-like works such as wafers under a vacuum condition in manufacture of semiconductors, for example.

2. Description of the Related Art

In manufacture of semiconductors, works are moved into and out of a number of process chambers. Specifically, works are moved between an atmospheric transfer module and each process chamber via an vacuum transfer module. As shown in FIG. 14, such a vacuum transfer module consists of a transport chamber 12 (to which the process chambers 11 are connected) and loadlocks 13 (connecting the transport chamber 12 to the atmospheric transfer module 20), for example. The loadlocks 13 have a first door 13a to the atmospheric transport module 20 and a second door 13b to the transport chamber 12. To move a work from the atmospheric transport module 20 into the loadlock 13, the first door 13a is opened, while the second door 13b is closed. Thus, the internal pressure of the loadlock 13 becomes atmospheric. Then, the first door 13a is closed, and the second door 13b are opened to move the work from the loadlock 13 into the transport chamber 12. At this stage, the internal pressure of the loadlock 13 becomes equal to that of the transport chamber 12 (that is, vacuum). Each process chamber 11 has a door 11a to the transport chamber 12, and opening the door 11a allows movement of works between the transport chamber 12 and the process chamber 11.

Transfer of works between the atmospheric transport module 20 and the loadlock 13 is implemented by a transfer robot on the side of the atmospheric transport module 20. Transfer of works between the loadlock 13 and the transport chamber 12, and between the transport chamber 12 and the process chamber 11 is implemented by a transfer robot placed in the transport chamber 12. The present invention relates to a transfer robot suitable for use in the transport chamber 12.

A conventional transfer robot of the above type is disclosed in JP-A-11 (1999)-33951, for example. As shown in FIG. 15, the conventional transfer robot includes two arm mechanisms 31, 32 mounted on a base 30. The base 30 is pivotable about a vertical shaft (or more appropriately, a vertical axis of the shaft). Each arm mechanism 31, 32 is provided with two parallelogram linkages connected to each other. As shown in FIG. 15, in each arm mechanism, a terminal link 35 is pivotably connected to two parallel rods. The terminal link member 35 supports a hand member 33 or 34 for carrying a plate-like work such as a wafer. When operated, the arm mechanisms 31, 32 can deform without interfering with each other, to move the respective terminal link members 35 horizontally along straight operation paths which are parallel to each other. Typically, such hand members are connected to the terminal links 35 via a connecting stay. When the arm mechanisms 31, 32 are operated, the hand members 33, 34 move forward or backward along predetermined paths Tr1, Tr2 which seem to coincide with each other as viewed in plan but are vertically spaced from each other, as shown in FIG. 16. Accordingly, the upper surfaces (wafer-carrying surfaces) of the respective hand members 33, 34 are disposed at different heights.

A work in the loadlock 13 is moved into the transport chamber 12 in the following manner. First, the base 30 is turned about the vertical shaft through an appropriate angle to direct the hand members 33, 34 toward the loadlock 13. Then, one of the hand members 33, 34 is extended into the loadlock 13, through the second door 13b, to pick up the work. Finally, the hand member 33 or 34 is drawn back into the transport chamber 12.

The work brought into the transport chamber 12 can be moved further into the process chambers 11 as follows. First, the base 30 is turned about to direct the hand members 33, 34 toward the selected one of the process chambers 11. Then, the hand member 33 or 34 carrying the work is extended into the process chamber 11 through the door 11a, to place the work in the chamber 11. Finally, the hand member 33 or 34 is drawn back into the transport chamber 12. As readily understood, after the treatment of the work in the process chamber 11 is over, the work is transferred back in the same manner as described above, from the process chamber 11 to the transport chamber 12, and to the loadlock 13.

The transfer robot described above has two hand members 33, 34 that are independently operable. With such an arrangement, works can be moved into and out of the process chamber 11 efficiently. For instance, it is possible, with the door 11a kept open, to take a processed work out from the chamber 11 by one hand member, while holding another work to be processed near the chamber 11 by the other hand so that this work can be put into the chamber 11 immediately after the processed work is out.

In the conventional transfer robot, the paths Tr1, Tr2 for the hand members 33, 34 are vertically spaced from each other, as noted above. Therefore, as seen from FIG. 16, the door 11a of each process chamber 11 needs to have a rather large vertical dimension to accommodate the two paths Tr1, Tr2 of different heights.

However, a large opening of the door 11a may cause irregular and disordered flow of air in the process chamber. Such turbulence may impede uniform surface treatment for a wafer.

SUMMARY OF THE INVENTION

The present invention has been proposed under the circumstances described above. It is, therefore, an object of the present invention to provide a transfer robot having two independently operable hand members whose linear operation paths are provided at the same height.

According to the present invention, there is provided a two-arm transfer robot comprising: a swivel base arranged to swivel about a vertical swivel axis; first and second link arm mechanisms attached to the swivel base, the first and second link arm mechanisms being symmetrical with respect to the swivel axis; a first hand member supported by the first link arm mechanism for carrying a work; and a second hand member supported by the second link arm mechanism for carrying a work. The first hand member and the second hand member are movable at a same height without interfering with each other.

Preferably, each of the first and the second link arm mechanisms may comprise: a first arm having a base end and a tip; a second arm substantially identical in length to the first arm and having a base end and a tip; and a movable member attached to the tip of the second arm to be pivotable about a vertical connection axis. Further, the base end of the first arm may be attached to the swivel base to be pivotable about a vertical pivot axis spaced from the swivel axis, and the base end of the second arm may be attached to the tip of the first arm to be pivotable about a vertical connection axis, and the second arm may be pivotable in a direction opposite to a pivot direction of the first arm at an angular rate which is twice as great as an angular rate of the first arm. Still further, the movable member may be attached to the tip of the second arm to be pivotable about a vertical connection axis, and the movable member may be moved along a horizontal linear path without changing initial orientation of the movable member when the first arm is caused to pivot.

Preferably, the path of the movable member of the first link arm mechanism and the path of the movable member of the second link arm mechanism may extend in parallel to each other at the same height. These paths may be horizontally spaced from each other.

Preferably, the two-arm transfer robot of the present invention may further comprise a first bracket for connecting the first hand member to the movable member of the first link arm mechanism and a second bracket for connecting the second hand member to the movable member of the second link arm mechanism. Each of the first and the second brackets may extend longitudinally of the horizontal linear path. The first hand member may be arranged not to interfere with the second bracket, while the second hand member may be arranged not to interfere with the first bracket.

Preferably, in each of the first and the second link arm mechanisms, the first arm may have a pivot angle range defined by a first limit position and a second limit position. When the first arm is in the first limit position, the movable member may be disposed on a prescribed side of the pivot axis. However, when the first arm is in the second limit position, the movable member may be disposed on the opposite side of the pivot axis.

Preferably, in each of the first and the second link arm mechanisms, the bracket may extend from the movable member to the pivot axis when the first arm is in the first limit position. Further, the hand member may be supported by the bracket to be oriented in a direction in which the bracket extends.

Preferably, in each of the first and the second link arm mechanisms, the hand member may be attached to an upper surface of the bracket in a manner such that the hand member overhangs the bracket of the other link arm mechanism when the first arm is in the first limit position.

Preferably, the first hand member and the second hand member may be movable along a common horizontal linear path. Further, the displacement range of the first hand member along the common path and the displacement range of the second hand member along the common path may have no overlap.

Preferably, each of the first and the second link arm mechanisms may comprise: a first parallelogram linkage including the first arm; a second parallelogram linkage including the second arm and the movable member; and an intermediate connector shared by the first and the second parallelogram linkages.

Preferably, each of the first and the second hand members may have a configuration appropriate for carrying a flat round work.

Other features and advantages of the present invention will become apparent from the detailed description given below with reference to the accompanying drawings.

DETAILED DESCRIPTION OF THE PREFERRED EMBODIMENTS

Preferred embodiments of the present invention will be described below with reference to the accompanying drawings.

Figure 1:
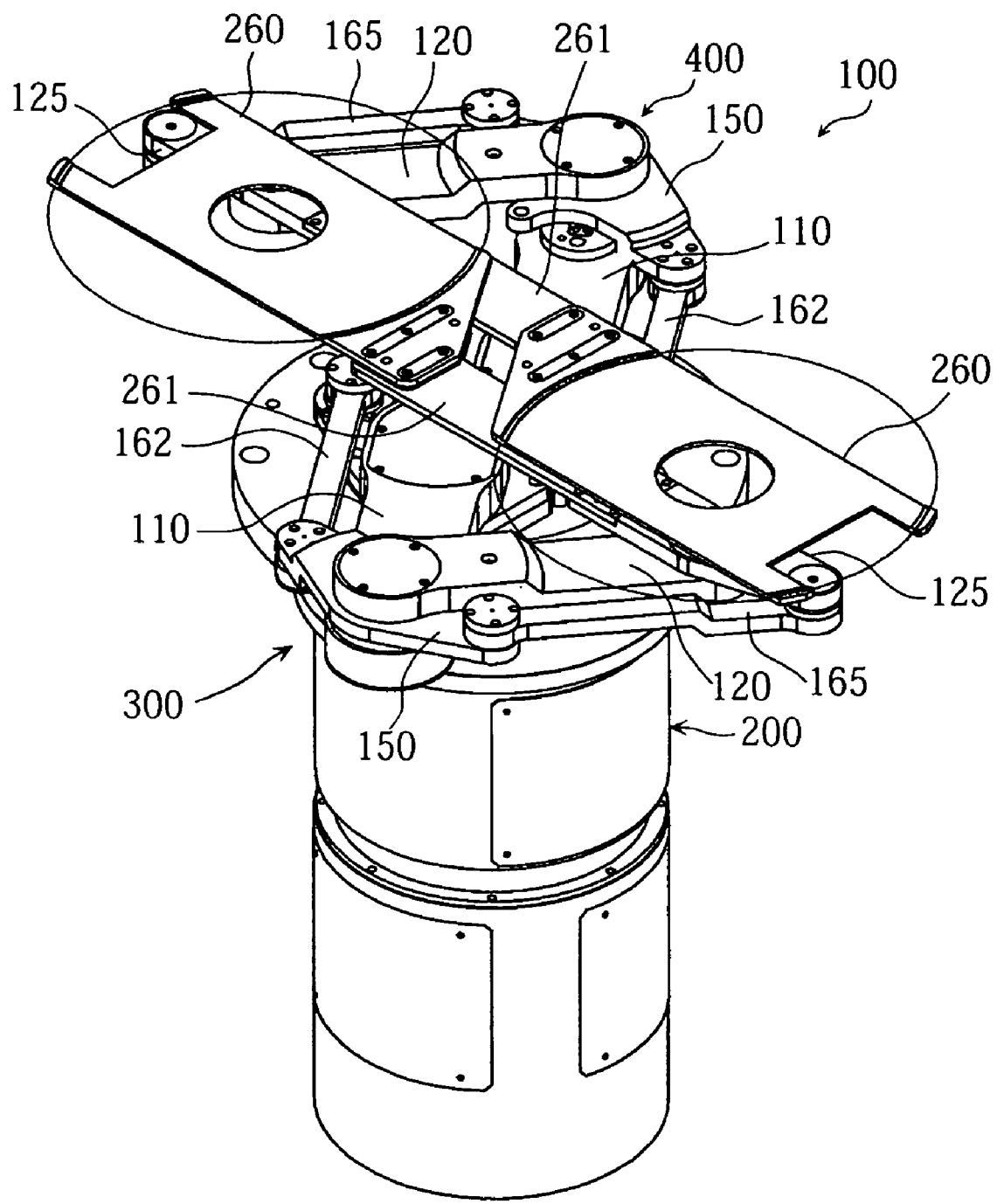
FIG. 1 is a perspective view showing a two-arm transfer robot according to the present invention, with the two hand members retreated to the maximum.
Figure 4:
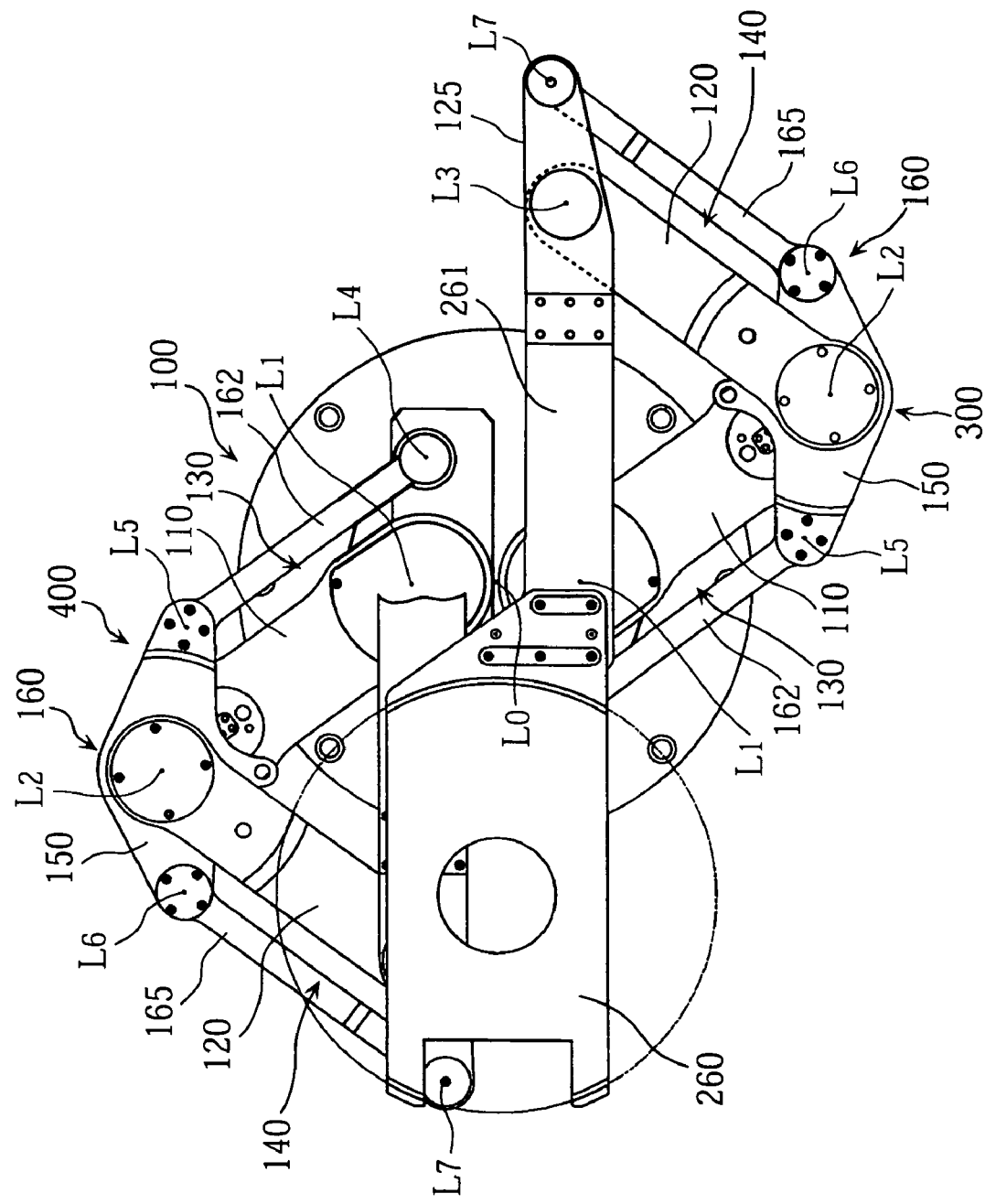
FIG. 4 is a plan view showing the two-arm transfer robot in the state shown in FIG. 1.
Figure 5:
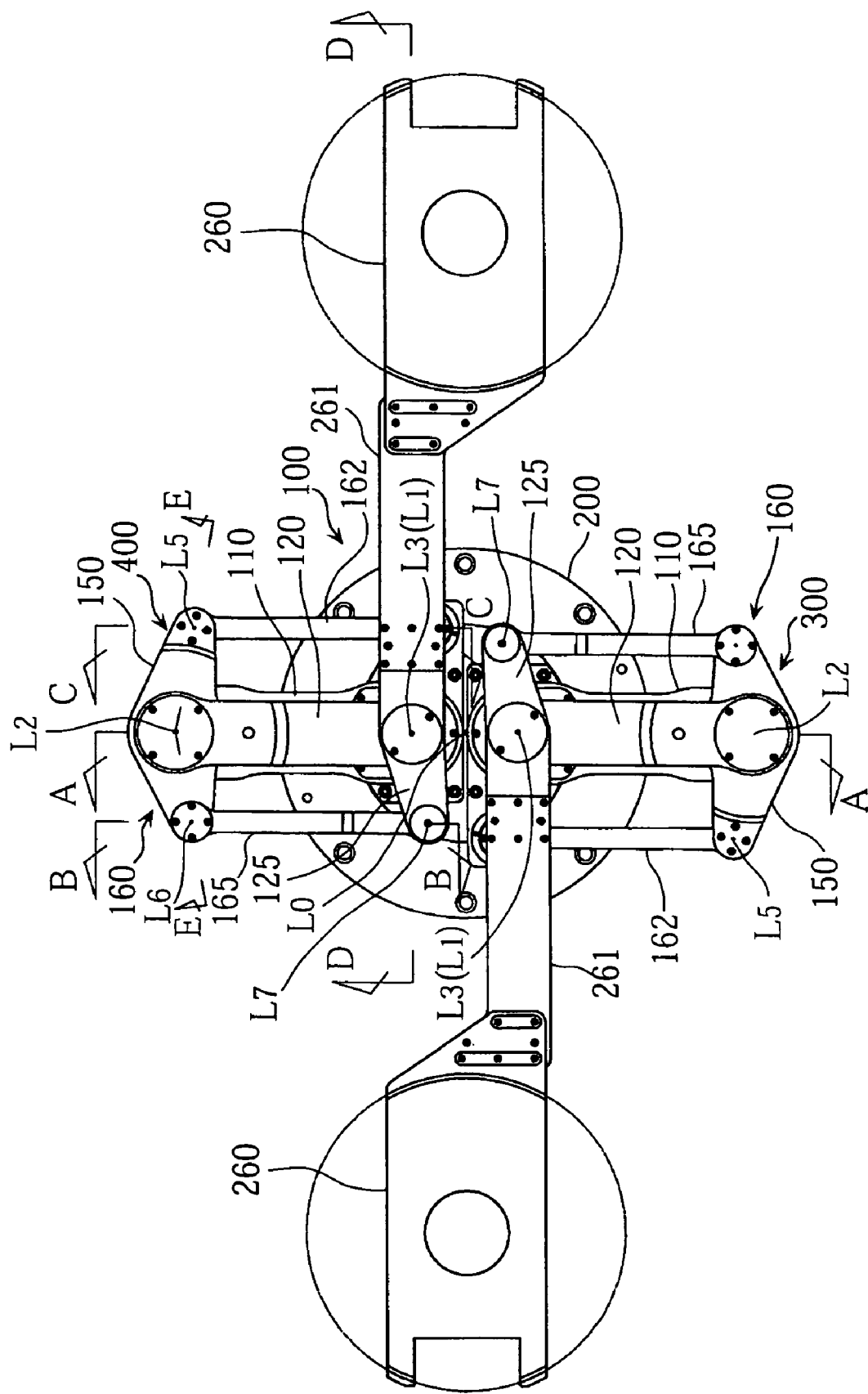
FIG. 5 is a plan view showing the two-arm transfer robot in the state shown in FIG. 3.
Figure 6:
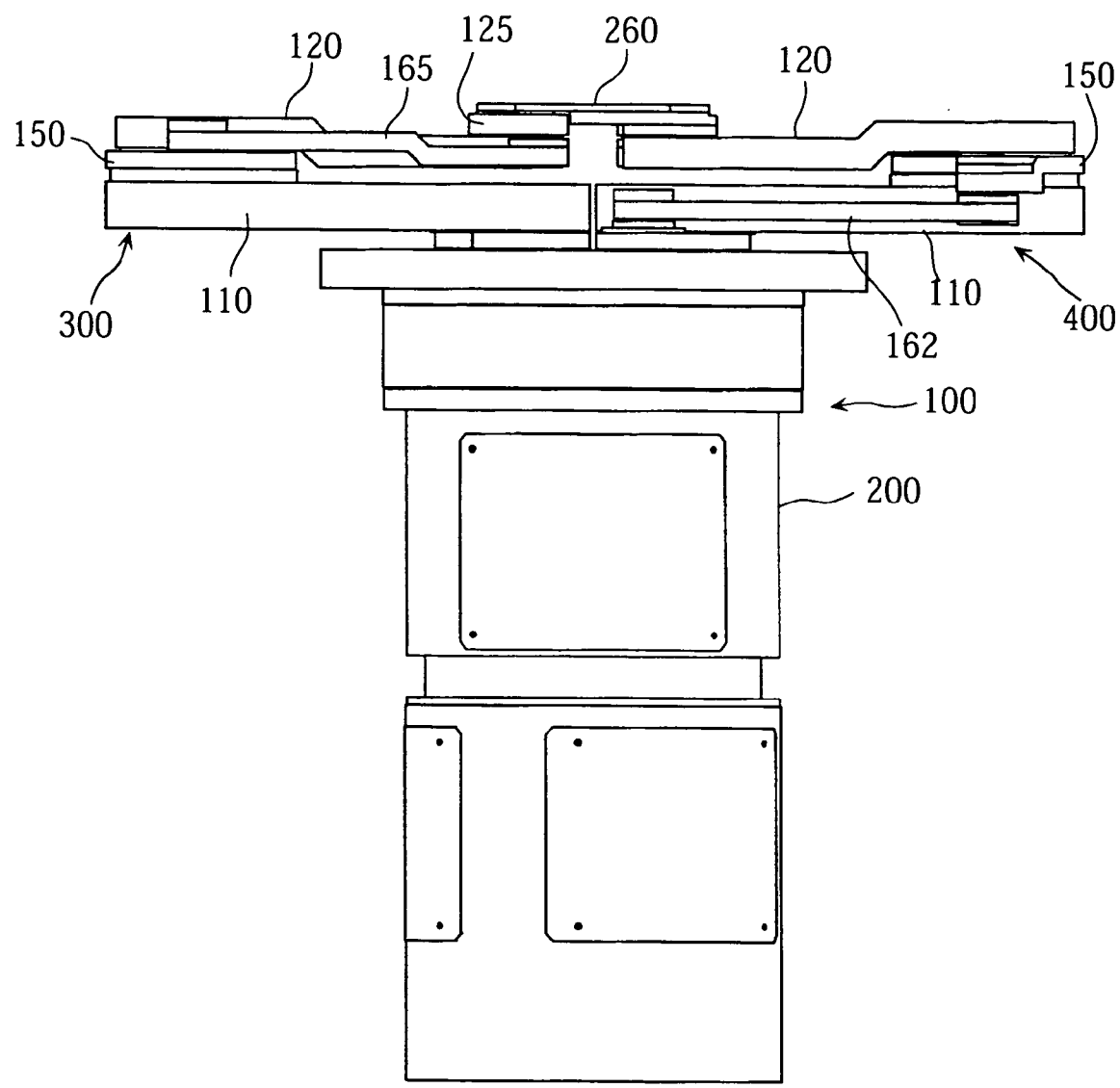
FIG. 6 is a side view showing the two-arm transfer robot in the state shown in FIG. 1.

Reference is first made to FIGS. 1–7 illustrating a two-arm transfer robot 100 according to the present invention. The transfer robot 100, as shown in FIGS. 1 and 6 for example, includes a cylindrical base frame 200, a first arm mechanism 300 and a second arm mechanism 400.

Figure 7:
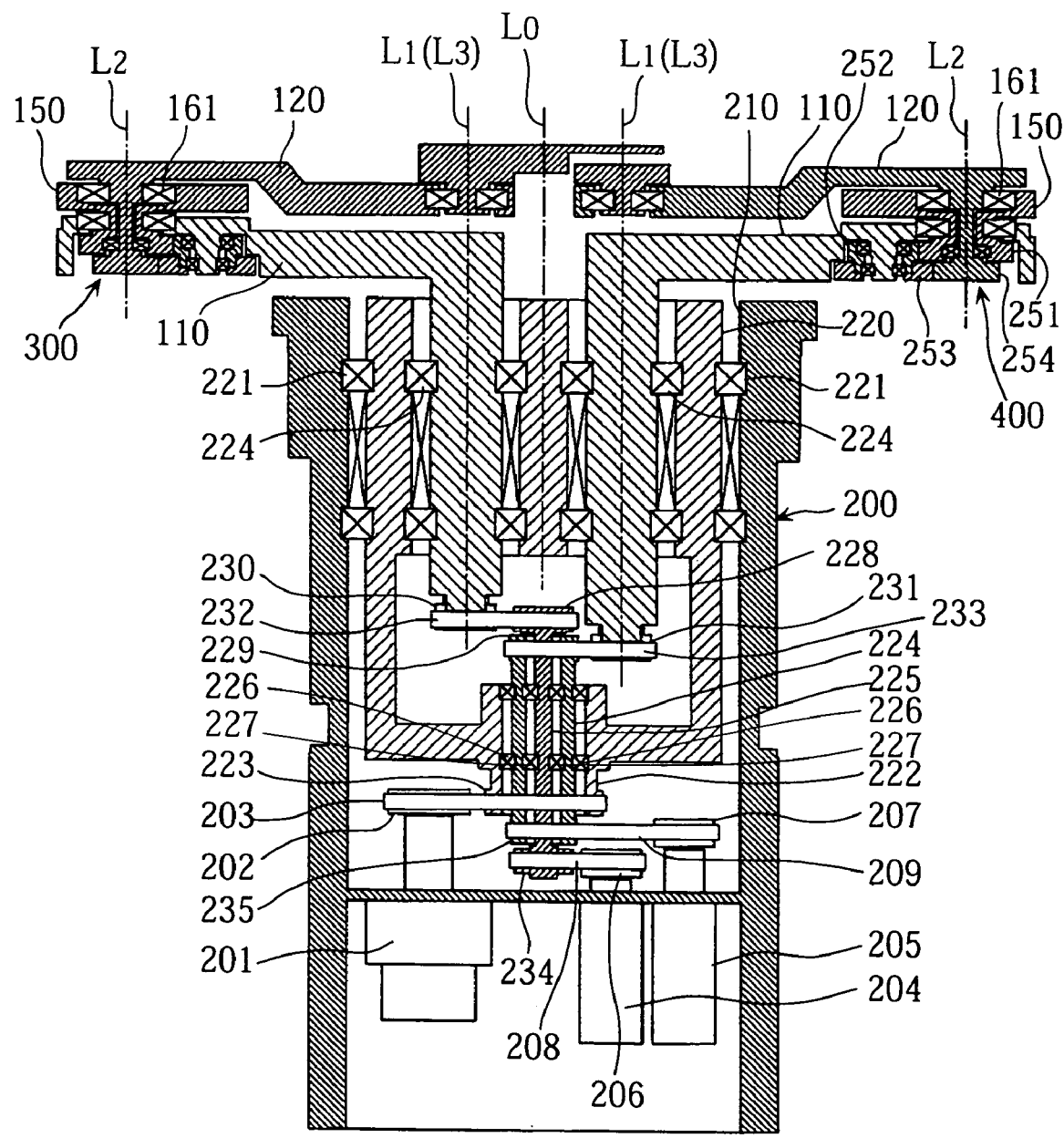
FIG. 7 is a sectional view taken along lines A—A in FIG. 5.

As shown in FIG. 7, the base frame 200 is formed with a circular upper opening 210 in which a swivel base 220 is provided. The swivel base 220 is pivotable about a vertical swivel axis $L_0$ of a swivel shaft. The swivel axis $L_0$ coincides with the central axis of the frame 200. As seen from FIGS. 2, 4 and 5, for example, the swivel base 220 supports the first and second arm mechanisms 300, 400.

The first and the second arm mechanisms 300 and 400, having the same or substantially the same design, are arranged symmetrically with respect to the swivel axis $L_0$. Specifically, each mechanism 300, 400 includes a first arm 110, a second arm 120 and a terminal link (or "movable member") 125. The first arm 110 is connected to the swivel base 220 to be pivotable about a vertical pivot axis $L_1$ of a pivot shaft. As shown in FIG. 4, the pivot axis $L_1$ is spaced from the swivel axis $L_0$ by an appropriate distance. The second arm 120 is connected at one end to the first arm 110 to be pivotable about a vertical connection axis $L_2$ of a connection shaft. At the other end, the second arm 120 is pivotably connected to the terminal link 125. The terminal link 125 is pivotable relative to the second arm 120 about a vertical support axis $L_3$ of a support shaft.

As shown in FIG. 7, the swivel base 220, which is cylindrical, is assembled to the base frame 200 via a bearing 221 which allows the base 220 to pivot about the swivel axis $L_0$. As illustrated, the bearing 221 is disposed between the inner wall of the frame 200 and the outer wall of the swivel base 220. The swivel base 220 includes, at a lower portion thereof, a pulley shaft 222 on which a pulley 223 is provided. The pulley 223 is driven by an endless belt 203, a drive pulley 202 and a pivot motor 201 placed in a lower portion of the frame 200. By driving the pivoting motor 201 in a forward or reverse direction, the swivel base 220 is caused to pivot in a forward or reverse direction. The swivel base 220 pivotably supports, via a bearing 224, the pivot shaft (the axis of which is designated by $L_1$) for the arm mechanisms 300, 400. The pivot shaft has an upper portion to which the base end of the first arm 110 is connected. The pulley shaft 222 is hollow so that it can accommodate rotatable concentric shafts 224, 225 within itself via bearings 226, 227. The concentric shafts 224, 225 have upper ends formed with pulleys 228 and 229, respectively. The pivot shafts have lower ends provided with pulleys 230 and 231, respectively, and two endless belts 232 233 connecting two pairs of the pulleys. The concentric shafts 224, 225 have lower ends formed with pulleys 234, 235 respectively, the frame 200 has a lower portion provided with a first and a second arm drive motors 204, 205 which have output shafts provided with pulleys 206 and 207, respectively. Two endless belts 208, 209 connect respective two pairs of the pulleys. In this arrangement, by driving the first and the second arm drive motors 204, 205 in the forward or reverse direction, the first arms 110 is caused to pivot in the forward or reverse direction around the pivot shaft through a predetermined angle.

As seen from FIG. 4, each of the arm mechanisms 300, 400 is provided with first and second parallelogram linkages 130 and 140. The first linkage 130 includes, among other things, the above-mentioned first arm 110, while the second linkage 140 includes, among other things, the above-mentioned second arm 120 and terminal link 125. The first and the second linkages 130, 140 are connected to each other via an intermediate connector 150 (the connector 150 is shared by both linkages), thereby providing an orientation regulator 160. The orientation regulator 160 (namely, the combination of the linkages 130, 140 and the connector 150) causes the terminal link 125 to maintain the predetermined initial orientation relative to the swivel case 220 regardless of the pivotal movement of the first arm 110 relative to the swivel base 220 and the pivotal movement of the second arm 120 relative to the first arm 110.

Figure 9:
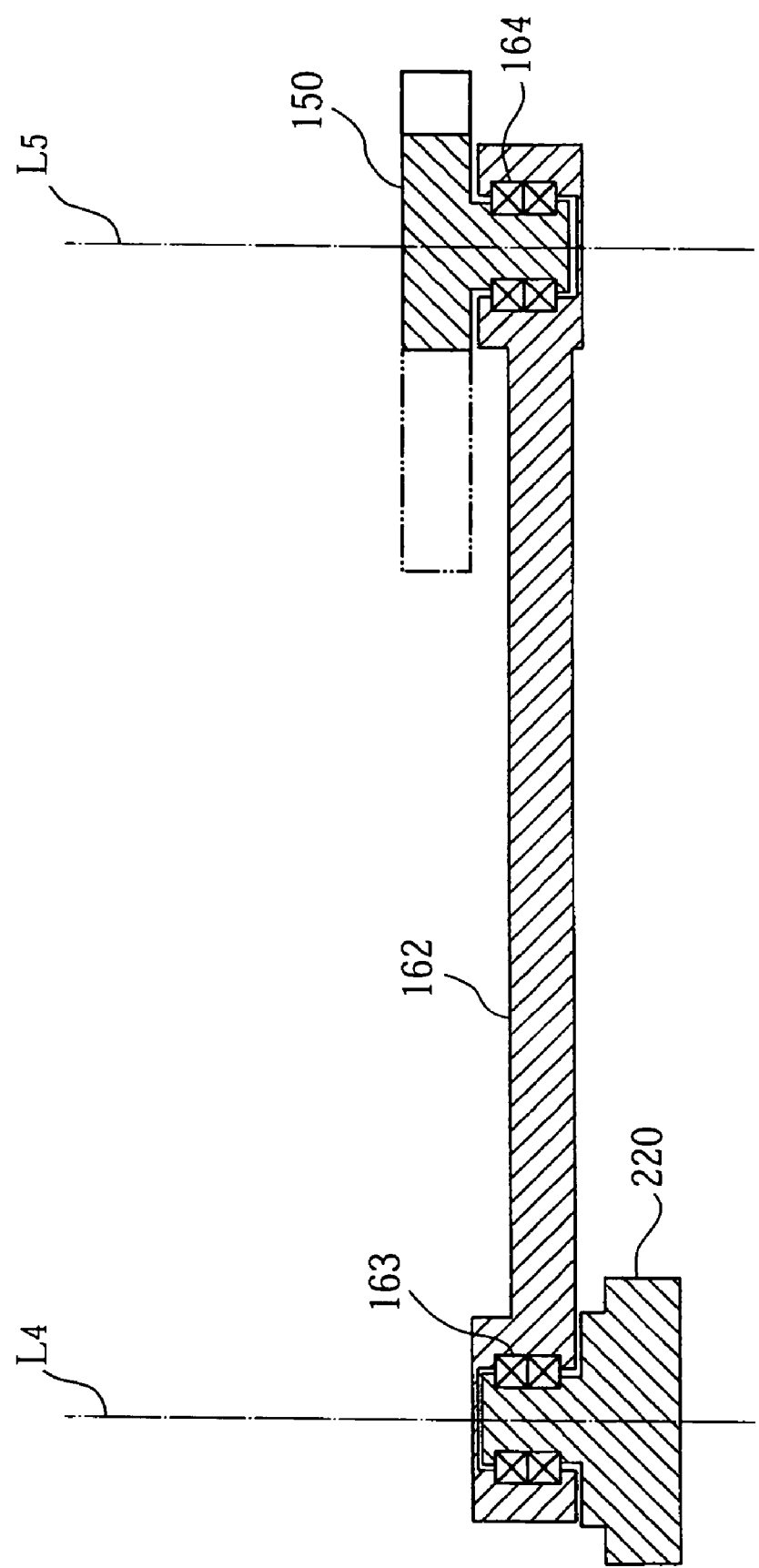
FIG. 9 is a sectional view taken along lines C—C in FIG. 5.

As shown in FIG. 7, the intermediate connector 150 is connected to a tip of the first arm 110 via a bearing 161 so as to be pivotable around the connection axis $L_2$. Further, a first assisting arm 162 (extending in parallel to the first arm 110; see FIG. 4, for example) is connected to the swivel base 220 via a bearing 163, as shown in FIG. 9, so as to be pivotable around a vertical axis $L_4$. The first assisting arm 162 is included in the first linkage 130. The first assisting arm 162 has a tip which is pivotably connected to the intermediate connector 150 via a bearing 164 to be pivotable around a vertical axis $L_5$.

Figure 8:
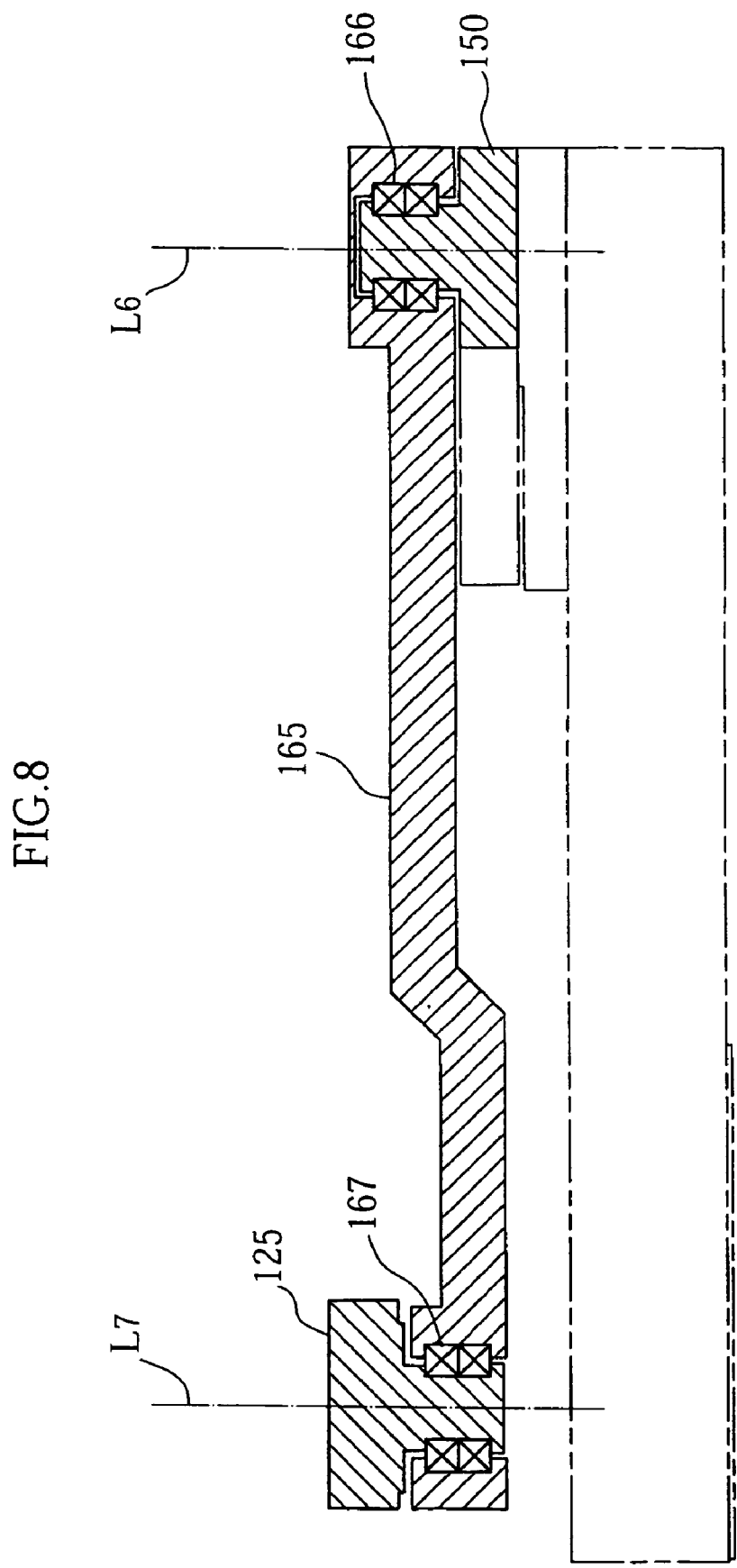
FIG. 8 is a sectional view taken along lines B—B in FIG. 5.
Figure 10:
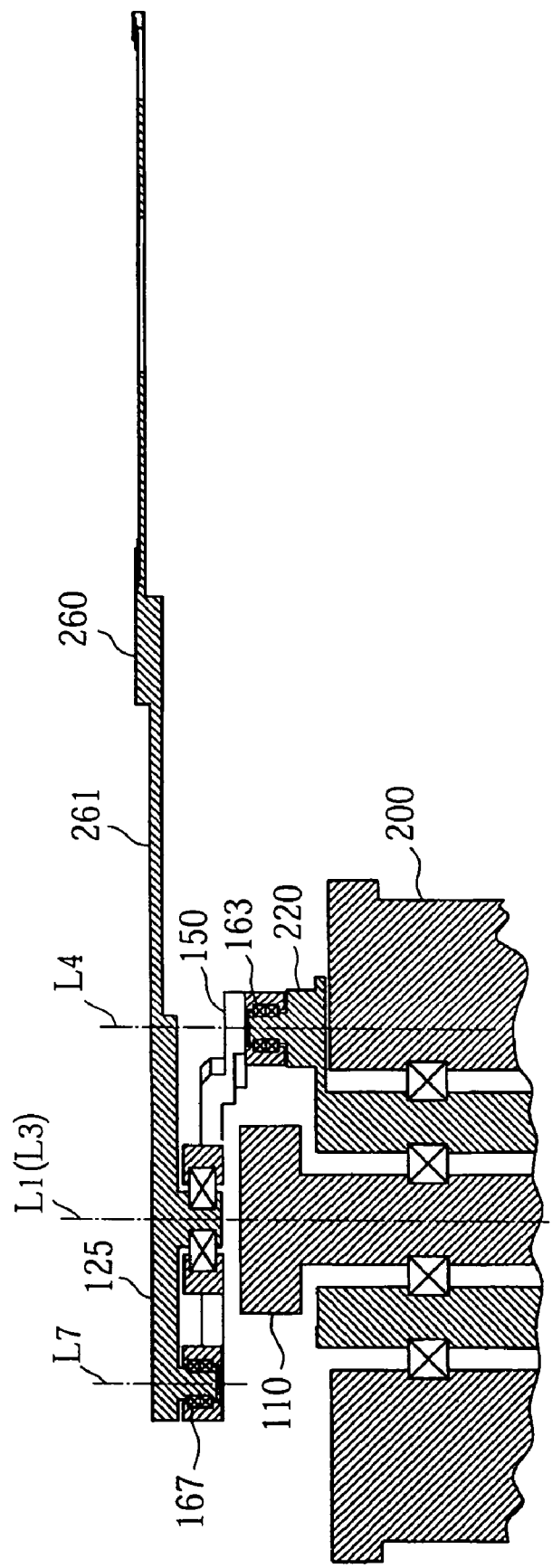
FIG. 10 is a sectional view taken along lines D—D in FIG. 5.

For constituting the second linkage 140, a second assisting arm 165 is provided. The second assisting arm 165 extends in parallel to the second arm 120 (see FIG. 4, for example) and has a base end connected to the intermediate connector 150 via a bearing 166 (see FIG. 8) to be pivotable about a vertical axis $L_6$. The second assisting arm 165 has also the opposite tip which is connected to the terminal link 125 via a bearing 167 to be pivotable about a vertical axis $L_7$ (see FIG. 10).

Figure 11:
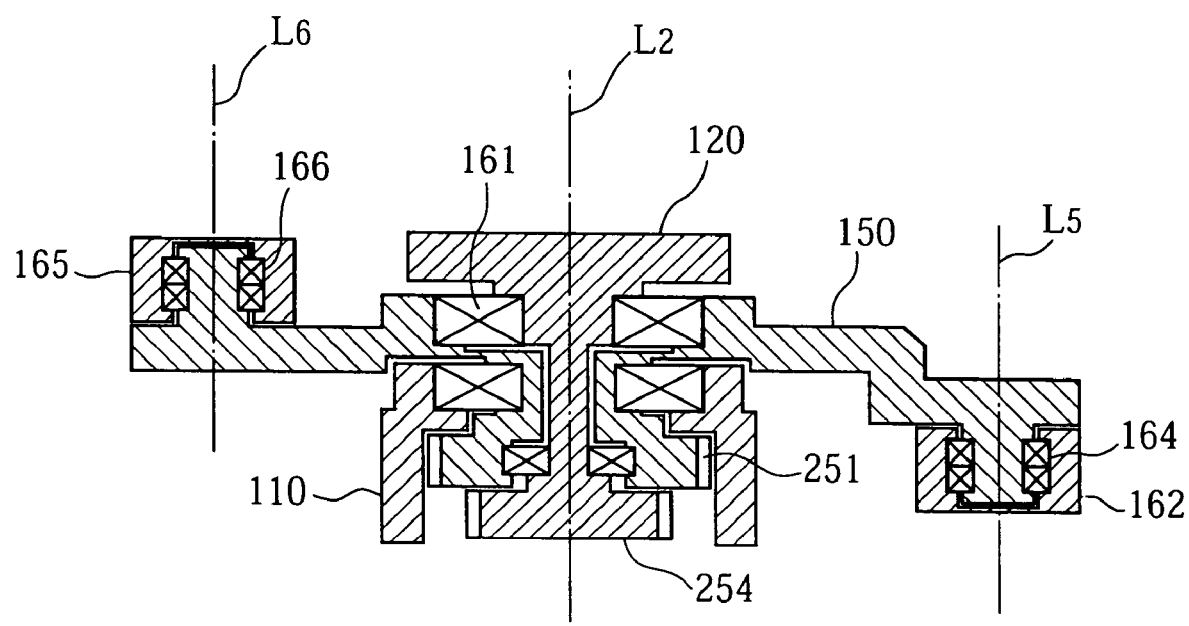
FIG. 11 is a sectional view taken along lines E—E in FIG. 5.

The intermediate connector 150 is pivotable about the connection axis $L_2$ at its longitudinally central region, and has one longitudinal end connected to the tip of the first assisting arm 162, and the other end connected to the base end of the second assisting arm 165. As shown in FIG. 11, the second arm 120 and the second assisting arm 165 are higher than the first arm 110 and the first assisting arm 162 for avoiding the interfere with the first arm 110 or the first assisting arm 162. Accordingly, in the intermediate connector 150, the connection to the second assisting arm 165 is higher than the connection to the first assisting arm 162.

The first arm 110 and the second arm 120 have the same or substantially the same length. Here, the "length" of the first arm 110 refers to the distance between the pivot axis $L_1$ and the connection axis $L_2$, and the "length" of the second arm 120 refers to the distance between the connection axis $L_2$ and the support axis $L_3$.

In addition to the above equal-length arrangement, the second arm 120 is linked to the first arm 110 in a manner such that the second arm 120 is caused to pivot at twice the angular velocity of the first arm 110 in the direction opposite to the pivot direction of the first arm 110. As a result, the terminal link 125 at the tip of the second arm 120 is able to move along a horizontal straight path as the first arm 110 pivots around the pivot axis $L_1$. In the present embodiment, the above linkage between the first arm 110 and the second arm 120 is realized in a manner described below.

As shown in FIG. 7, a first gear 251 is formed integral with the intermediate connector 150, the central axis of the gear 251 coinciding with the connection axis $L_2$, around which the first arm 110 and the second arm 120 are pivotable relative to each other. The first gear 251 is engaged by a second gear 252 which is rotatably supported by the first arm 110. The second gear 252 is integral with a third gear 253 which engages with a fourth gear 254 formed integral with the second arm 120. The central axis of the gear 254 coincides with the connection axis $L_2$. The overall gear ratio involving the first gear 251 to the fourth gear 254 is two.

In the above arrangement, the intermediate connector 150 is oriented in the same direction. When the first arm 110 pivots clockwise through an angle θ relative to the intermediate connector 150, then the second arm 120 pivots counterclockwise through an angle θ relative to the intermediate connector 150. Thus, when the first arm 110 pivots clockwise by an angle θ around the pivot axis $L_1$, then the second arm 120 pivots counterclockwise by the double angle 2θ relative to the first arm 110. As viewed in plan, the pivot axis $L_1$, the connection axis $L_2$ and the support axis $L_3$ are always located at the three apexes of an isosceles triangle, with its base provided by a line segment connecting the pivot axis $L_1$ and the support axis $L_3$. The extending direction of this line segment is kept the same with respect to the swivel base 220.

With the above arrangements, when the first arms 110 of the respective arm mechanisms 300, 400 are caused to pivot about the pivot axis $L_1$, the terminal link 125 of each mechanism 300, 400 moves along a predetermined horizontal straight path. At this time, the initial orientation of the terminal link 125 (with respect to the swivel base 220) is maintained by the orientation regulator mentioned above. In addition, the arm mechanisms 300, 400 are symmetrical with respect to the pivot axis $L_1$. Accordingly, the paths Tr1, Tr2 of the respective terminal links 125 are parallel to each other and disposed at the same height, as seen from FIG. 12, for example.

Figure 2:
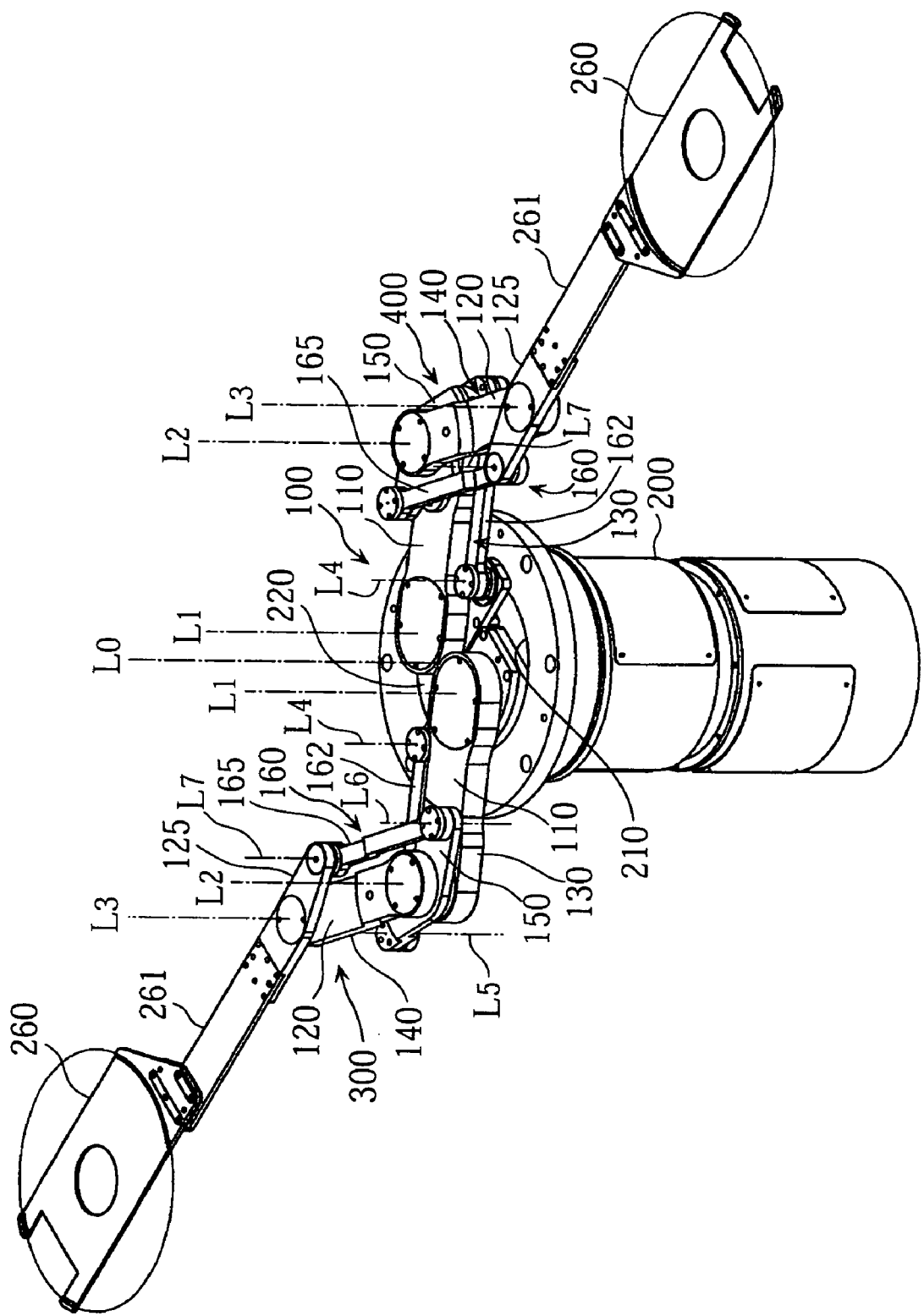
FIG. 2 is a perspective view showing the two-arm transfer robot in FIG. 1, with the two hand members extended to the maximum.
Figure 3:
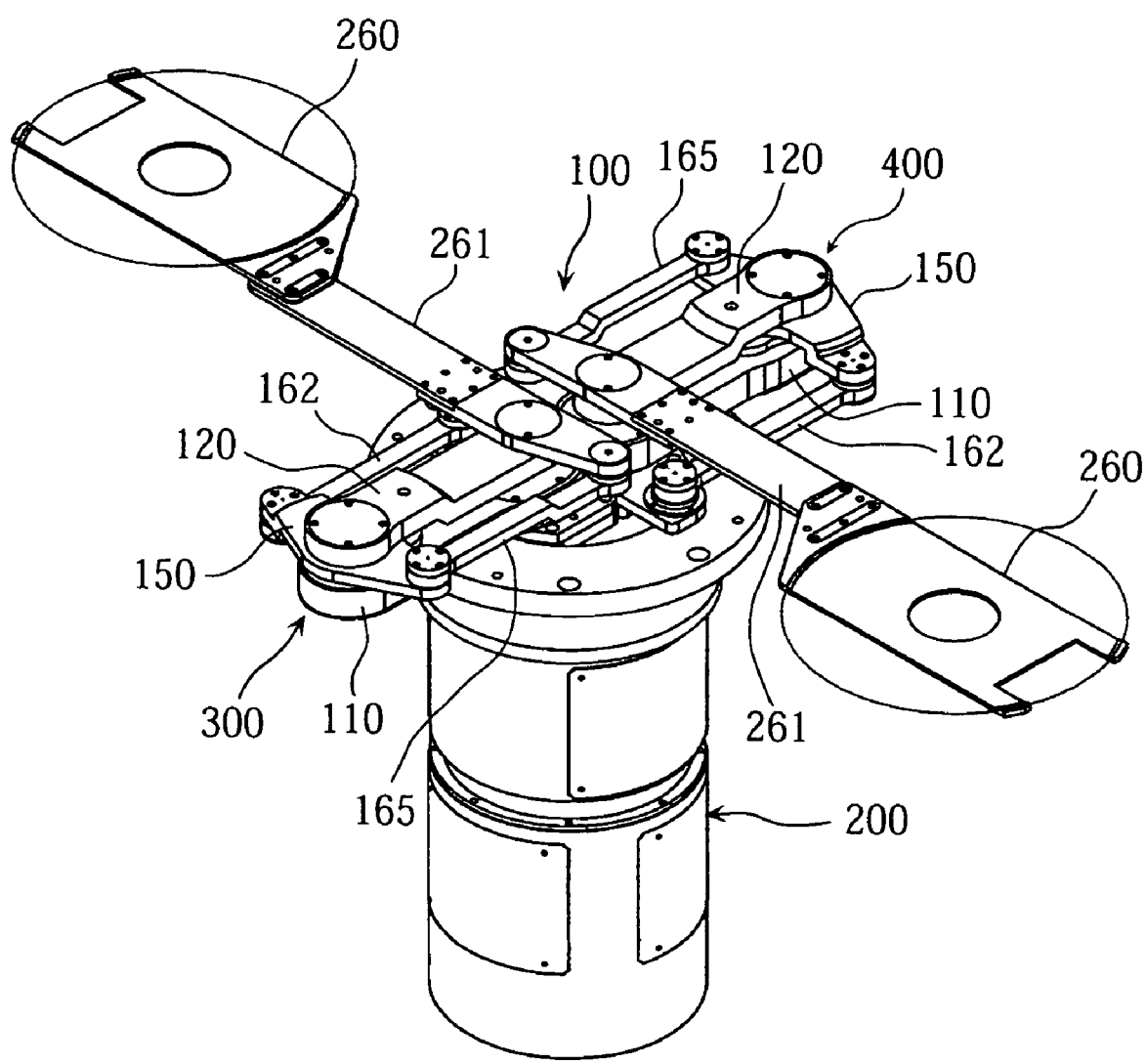
FIG. 3 is a perspective view showing the two-arm transfer robot in FIG. 1, with the two hand members held at an intermediate position of its moving stroke.

The first arm 110 is designed to pivot within a predetermined range defined by a first limit position and a second limit position opposite to the first limit position. Specifically, FIGS. 1 and 4 show the first arm 110 being disposed at the first limit position, whereby the hand members 260 are held in the retreated position. FIG. 2, on the other hand, shows the first arm 110 being disposed at the second limit position, whereby the hand members 260 are held in the unfolded position. FIGS. 3 and 5 show the first arm 110 being disposed at the intermediate position between the first limit position and the second limit position.

In the retreated position, as shown in FIG. 4, the first arm 110 of the arm mechanism 300 is located to the left of the second arm 120 of the mechanism 300 (with respect to the connection axis $L_2$), while the first arm 110 of the other arm mechanism 400 is located to the right of the second arm 120 of the mechanism 400 (with respect to the connection axis $L_2$). It should be noted that in FIG. 4, the hand member 260 of the arm mechanism 300 is depicted, whereas the hand member of the other arm mechanism 400 is omitted for clarity of illustration.

In the unfolded position shown in FIG. 2, the locational relations of the first and the second arms 110, 120 in each arm mechanism are opposite to those for the there treated position best shown in FIG. 4. Specifically, in the unfolded position, the first arm 110 of the arm mechanism 300 is located to the right of the second arm 120 of the mechanism 300 with respect to the connection axis $L_2$. Further, the first arm 110 of the other arm mechanism 400 is located to the left of the second arm 120 of the mechanism 400 with respect to the connection axis $L_2$.

In each of the arm mechanisms 300 and 400, the pair of the first arm 110 and the first assisting arm 162 is vertically offset from the pair of the second arm 120 and the second assisting arm 165, so that the former pair does not interfere with the latter pair. Thus, as described above, the second arm 120 can pivot or swing like a pendulum to the right and to the left relative to the first arm 110 beyond the so-called "change point" where the first arm 110 and the second arm 120 appear to overlap with each other as viewed in plan (see FIG. 5).

Wit such a pendulum-like arrangement, the transfer robot 100 can enjoy an appropriately long reciprocation stroke for each terminal link 125 even if the first and the second arms 110, 120 are rather short.

Each of the terminal links 125 supports a hand member 260 via a bracket 261. In the retreated position shown in FIG. 1 and FIG. 4, the bracket 261 extends from the terminal link 125 to the pivot axis $L_1$. The hand member 260 is supported by the tip of the bracket 261 to be oriented in the same direction as the bracket 261 extends (as best shown in FIG. 4). The bracket 261 is provided by a strip-like member for example, and the hand member 260 is attached to the upper surface of the tip of the bracket 261. The hand member 260 has a configuration suitable for carrying a circular work (typically a semiconductor wafer). In the retreated position, the hand member 260 partially overhang the upper surface of the bracket 261 of the other arm mechanism.

Figure 12:
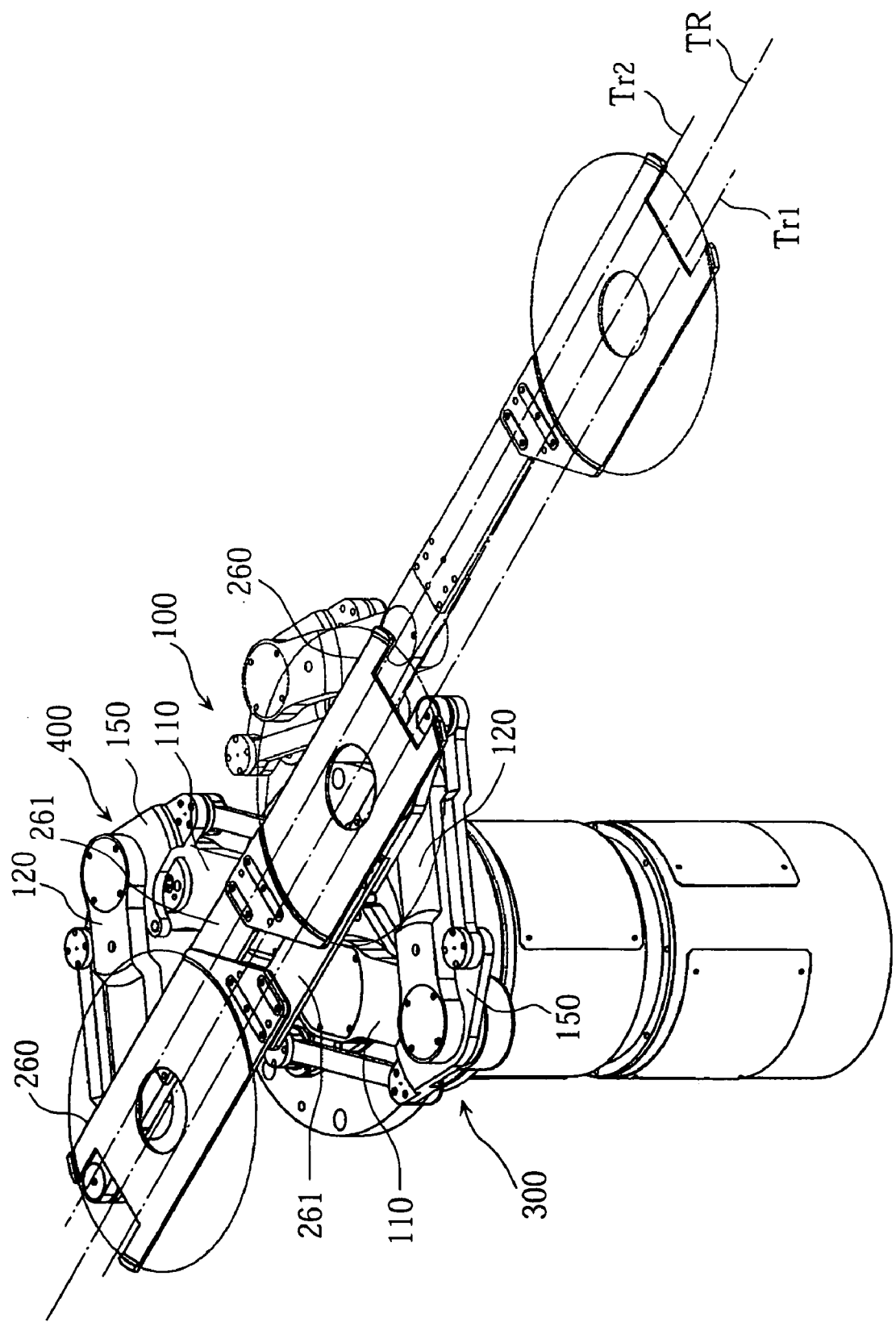
FIG. 12 is a perspective view illustrating the movement of the two-arm transfer robot.

In the present embodiment, as shown in FIG. 12, a single imaginary linear path TR is determined for the center of the hand members 260 of the arm mechanisms 300, 400. In operation, the two hand members 260 are caused to move along the common path TR in a symmetrical manner. Specifically, the two hand members 260 can be simultaneously moved away from the center of the robot (i.e., the swivel axis $L_0$) in the opposite directions, or simultaneously moved along the path TR toward the center of the robot.

However, the two hand members 260 are prevented from coming too close to each other. In other words, their displacement ranges both lie on the common path TR, but have no overlap.

Figure 14:
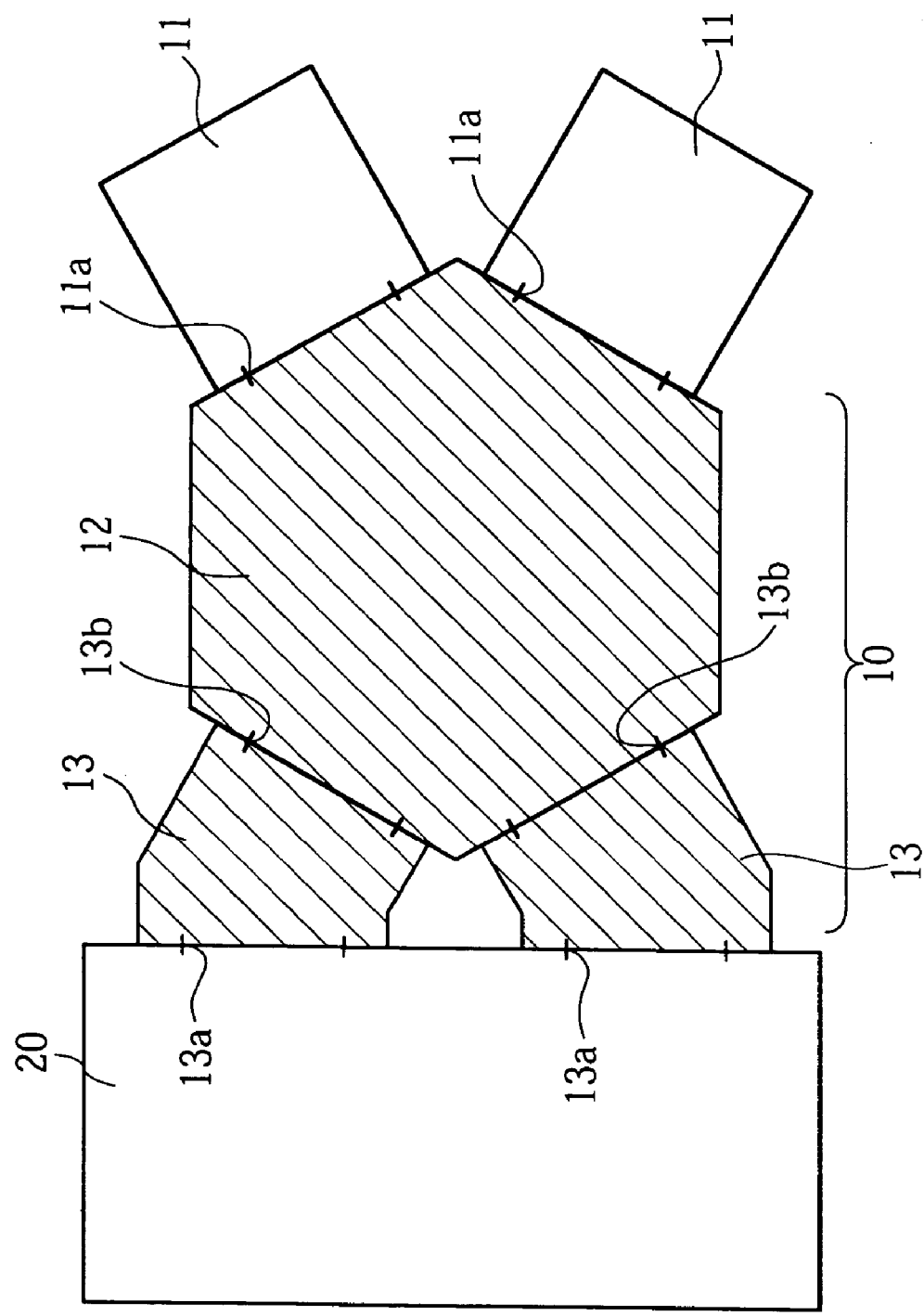
FIG. 14 is a plan view showing schematically a vacuum transfer module used for manufacture of semiconductors.
Figure 15:
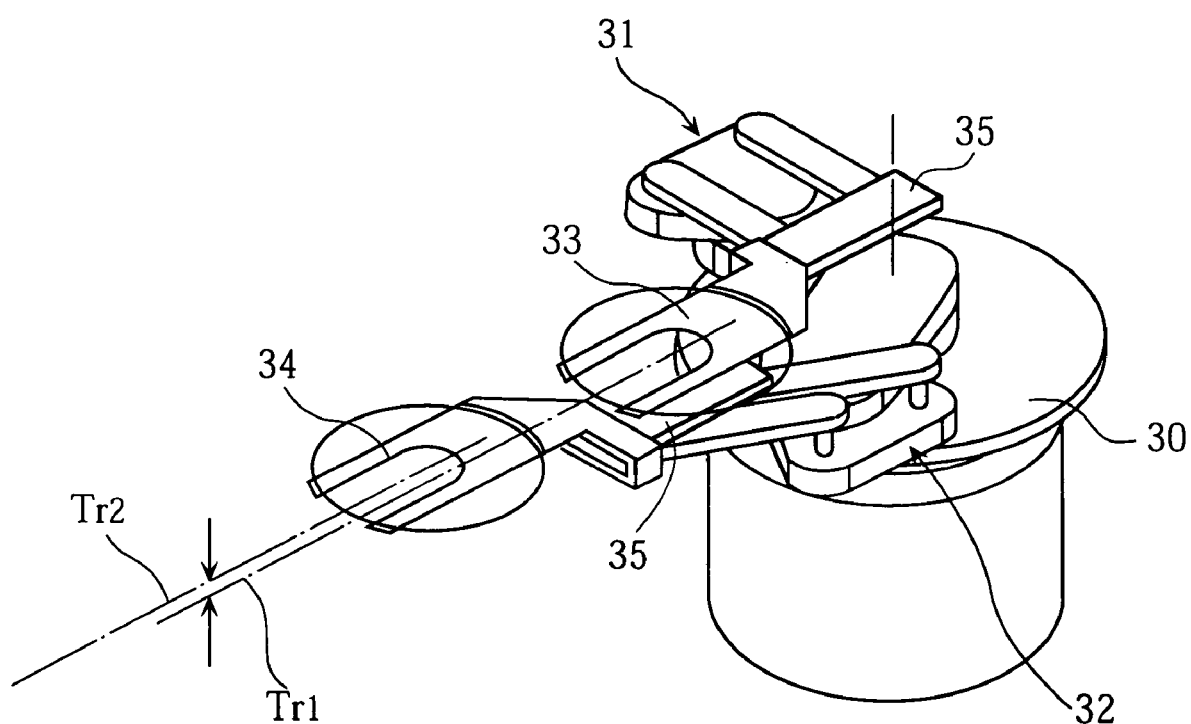
FIG. 15 is a perspective view showing a conventional two-arm transfer robot.

The transfer robot 100 may be installed in the vacuum transfer module 10 as shown in FIG. 14. In this case, a processed work in the process chamber 11 may be taken out from the process chamber into the transport chamber 12 in the following manner. First, the frame 200 is caused to pivot around the swivel axis $L_0$ so that a work-free hand member 260 among the two hand members is oriented toward the target process chamber 11. Then, the hand member 260 is extended into the process chamber 11 through the door 11a, to pick up the processed work. Then, the hand member 260 is drawn out from the process chamber 11. Successively, the frame 200 is pivoted by 180 degrees so that the other hand member 260 which carries a non-processed work is oriented to the target process chamber 11. Then this particular hand member 260 is extended into the chamber 11 through the door 11a, to place the work in the chamber. Finally this hand member 260 is retreated back to the transport chamber 12.

Figure 13:
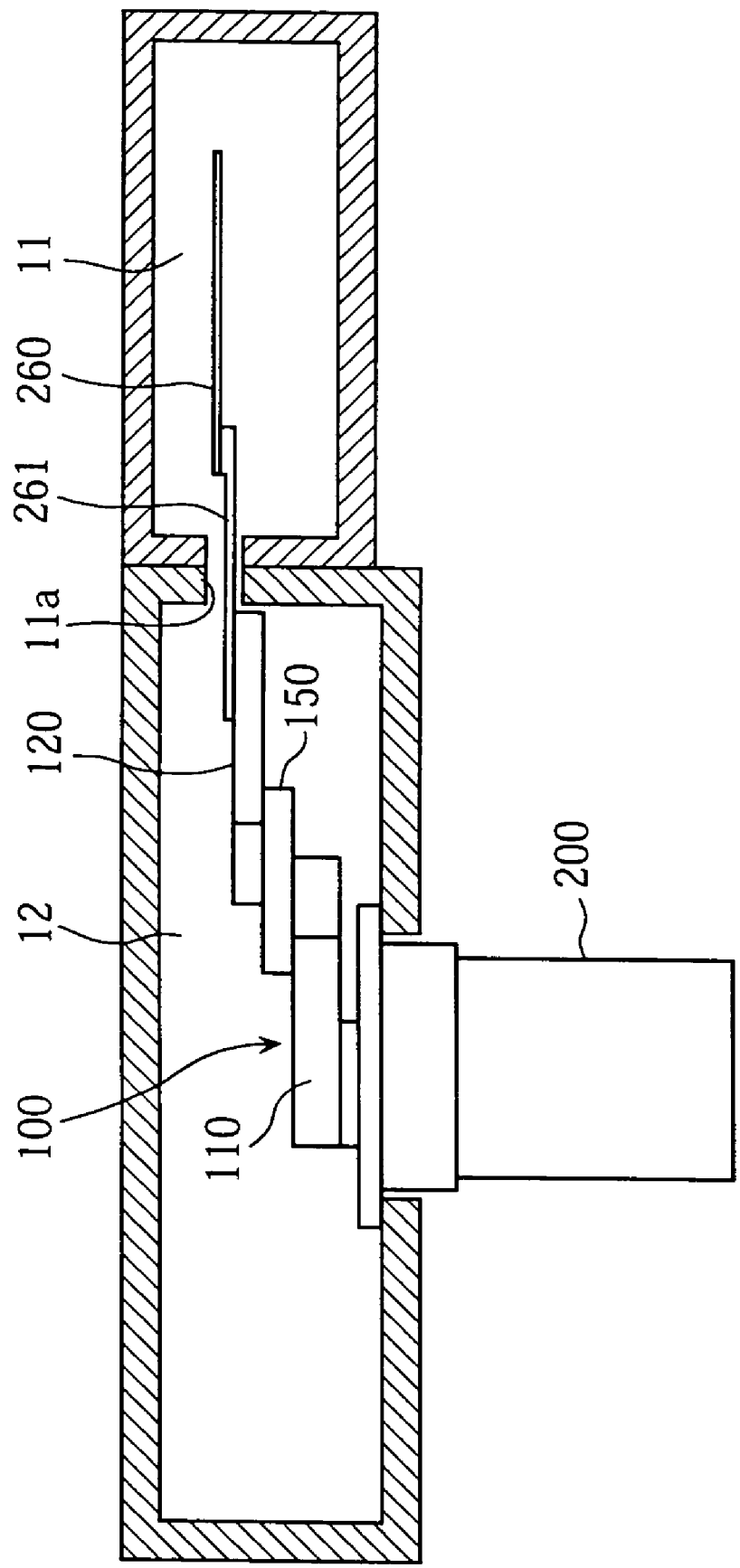
FIG. 13 illustrates the function of the two-arm transfer robot.
Figure 16:
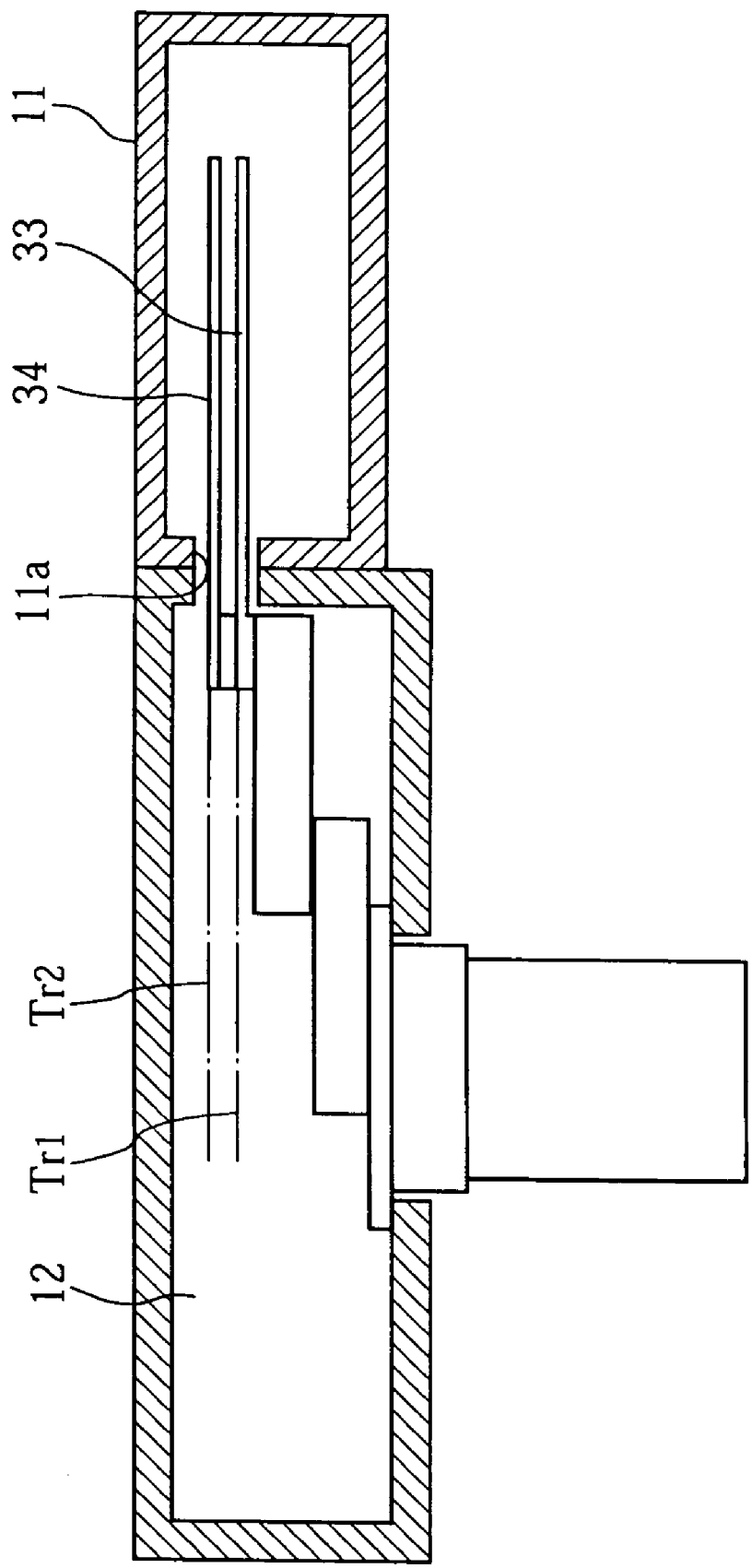
FIG. 16 illustrates the disadvantage of the conventional two-arm transfer robot.

According to the present invention, the two hand members 260 (and hence their upper surfaces) are at the same height (see FIG. 12, for example). Thus, as shown in FIG. 13, the door opening 11a of the process chamber 11 can have a smaller vertical dimension for passing the work than is conventionally possible (FIG. 16). Accordingly, it is possible to reduce the occurrence of a turbulence in the process chamber.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

The invention claimed is:

1. A two-arm transfer robot comprising:
a swivel base arranged to swivel about a swivel axis;
first end second link arm mechanisms attached to the swivel base, the first and second link arm mechanisms being symmetrical with respect to the swivel axis;
a first hand member supported by the first link arm mechanism for carrying a work; and
a second hand member supported by the second link arm mechanism for carrying a work;
wherein the first hand member and the second hand member are movable at a same height without interfering with each other;
wherein each of the first and the second link arm mechanisms is a parallelogram link mechanism which comprises a first arm having a tip and a base end pivotally connected to the swivel base at a first connection axis, a second arm substantially identical in length to the first arm and having a tip and a base end, an intermediate connector pivotally connected to the tip of the first arm and the base end of the second arm at a second connection axis, a movable member pivotally connected to the tip of the second arm at a third connection axis, a first assisting arm extending in parallel to the first arm and pivotally connected to the swivel base and the intermediate connector, and a second assisting arm extending in parallel to the second arm and pivotally connected to the intermediate connector and the movable member;
wherein the first arm, the second arm and the intermediate connector are provided with a gear transmission mechanism for converting pivotal movement of the first arm in one direction into pivotal movement of the second arm in an opposite direction at an angular rate which is twice as great as an angular rate of the first arm;

wherein all of the swivel axis and the first to third connection axes are vertical:

wherein each movable member is movable along a horizontal linear path without changing initial orientation of the movable member when the first arm is caused to pivot about the first connection axis; and wherein the path of the movable member of the first link arm mechanism and the path of the movable member of the second link arm mechanism extend in parallel to each other at a same height and are horizontally spaced from each other.

2. The two-arm transfer robot according to claim 1, further comprising a first bracket for connecting the first hand member to the movable member of the first link arm mechanism and a second bracket for connecting the second hand member to the movable member of the second link arm mechanism, wherein each of the first and the second brackets extends longitudinally of the horizontal linear path, the first hand member being arranged not to interfere with the second bracket, the second hand member being arranged not to interfere with the first bracket.

3. The two-arm transfer robot according to claim 2, wherein in each of the first and the second link arm mechanisms the first arm has a pivot angle range defined by a first limit position and a second limit position, the movable member being disposed on a prescribed side of the pivot swivel axis when the first arm is in the first limit position, the movable member being disposed on a side of the swivel axis that is opposite to said prescribed side when the first arm is in the second limit position.

4. The two-arm transfer robot according to claim 3, wherein in each of the first and the second link arm mechanisms, the bracket extends from the movable member to the swivel axis when the first arm is in the first limit position, the hand member being supported by the bracket to be oriented in a direction in which the bracket extends.

5. The two-arm transfer robot according to claim 4, wherein in each of the first and the second link arm mechanisms, the hand member is attached to an upper surface of the bracket, the hand member being arranged to overhang the bracket of the other link arm mechanism when the first arm is in the first limit position.

6. The two-arm transfer robot according to claim 1, wherein the first hand member and the second hand member are movable along a common horizontal linear path, and wherein a displacement range of the first hand member along the common path and a displacement range of the second hand member along the common path have no overlap.

7. The two-arm transfer robot according to claim 1, wherein each of the first and the second hand members has a configuration appropriate for carrying a flat round work.

8. A two-arm transfer robot comprising:
a swivel base arranged to swivel about a swivel axis;
first and second link arm mechanisms attached to the swivel base, the first and second link arm mechanisms being symmetrical with respect to the swivel axis;
a first hand member supported by the first link arm mechanism for carrying a work; and
a second hand member supported by the second link arm mechanism for carrying a work;
wherein the first hand member and the second hand member are movable at a same height without interfering with each other;
wherein each of the first and the second link arm mechanisms is a parallelogram link mechanism which comprises a first arm having a tip and a base end pivotally connected to the swivel base at a first connection axis, a second arm substantially identical in length to the first arm and having a tip and a base end, an intermediate connector pivotally connected to the tip of the firs arm and the base end of the second arm at a second connection axis, a movable member pivotally connected to the tip of the second arm at a third connection axis, a first assisting arm extending in parallel to the first arm and pivotally connected to the swivel base and the intermediate connector, and a second assisting arm extending in parallel to the second arm and pivotally connected to the intermediate connector and the movable member;

wherein the first arm, the second arm and the intermediate connector are provided with a gear transmission mechanism for converting pivotal movement of the first arm in one direction into pivotal movement of the second arm in an opposite direction at an angular rate which is twice as great as an angular rate of the first arm;

wherein all of the swivel axis and the first to third connection axes are vertical;

wherein each movable member is movable along a horizontal linear path without changing initial orientation of the movable member when the first arm is caused to pivot about the first connection axis;

wherein the transfer robot further comprises a first bracket for connecting the first band member to the movable member of the first link arm mechanism and a second bracket for connecting the second hand member to the movable member of the second link arm mechanism;

wherein each of the first and the second brackets extends longitudinally of the horizontal linear path, the first hand member being arranged not to interfere with the second bracket, the second hand member being arranged not to interfere with the first bracket;

wherein in each of the first and the second link arm mechanisms, the first arm has a pivot angle range defined by a first limit position and a second limit position, the movable member being disposed on a prescribed side of the swivel axis when the first arm is in the first limit position, the movable member being disposed on a side of the swivel axis that is opposite to said prescribed side when the first arm is in the second limit position;

wherein in each of the first and the second link arm mechanisms, the bracket extends from the movable member to the swivel axis when the first arm is in the first limit position, the hand member being supported by the bracket to be oriented in a direction in which the bracket extends; and wherein in each of the first and the second link arm mechanisms, the hand member is attached to an upper surface of the bracket, the hand member being arranged to overhang the bracket of the other link arm mechanism when the first arm is in the first limit position.

9. The two-arm transfer robot according to claim 8, wherein the first hand member and the second hand member are movable along a common horizontal linear path, and wherein a displacement range of the first hand member along the common path and a displacement range of the second hand member along the common path have no overlap.

10. The two-arm transfer robot according to claim 8, wherein each of the first and the second hand members has a configuration appropriate for carrying a flat round work.

* * * * *